(12) United States Patent
Lee et al.

(10) Patent No.: US 10,652,982 B2
(45) Date of Patent: May 12, 2020

(54) OPEN-MODE PROTECTION DEVICE AND ELECTRONIC DEVICE HAVING SAME

(71) Applicant: AMOTECH CO., LTD., Incheon (KR)

(72) Inventors: Jae Wook Lee, Incheon (KR); Jae Woo Choi, Gyeonggi-do (KR); Hyun Jin Jo, Gyeonggi-do (KR); Ji Woo Moon, Seoul (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 16/063,614

(22) PCT Filed: Dec. 21, 2016

(86) PCT No.: PCT/KR2016/014985
§ 371 (c)(1),
(2) Date: Jun. 18, 2018

(87) PCT Pub. No.: WO2017/111450
PCT Pub. Date: Jun. 29, 2017

(65) Prior Publication Data
US 2018/0376550 A1    Dec. 27, 2018

(30) Foreign Application Priority Data

Dec. 20, 2016    (KR) .................. 10-2016-0174516

(51) Int. Cl.
*H05B 45/50*    (2020.01)
*H05B 45/20*    (2020.01)
(Continued)

(52) U.S. Cl.
CPC ........... *H05B 45/50* (2020.01); *H01L 25/167* (2013.01); *H05B 45/20* (2020.01); *H01L 33/36* (2013.01); *H05B 45/40* (2020.01)

(58) Field of Classification Search
CPC .............. H05B 33/0821; H05B 33/089; H05B 33/0884; H05B 45/50; H05B 45/20; H05B 45/40; H01L 33/36; H01L 25/167
(Continued)

(56) References Cited

U.S. PATENT DOCUMENTS

2007/0025044 A1\*  2/2007  Golubovic ............. H01C 7/102
                                                        361/124
2010/0246171 A1   9/2010  Scale
(Continued)

FOREIGN PATENT DOCUMENTS

CN      102047353       5/2011
CN      103337848      10/2013
(Continued)

OTHER PUBLICATIONS

International Search Report Issued in PCT Application No. PCT/KR2016/014985, dated Apr. 14, 2017.
(Continued)

*Primary Examiner* — Dedei K Hammond
*Assistant Examiner* — Amy X Yang
(74) *Attorney, Agent, or Firm* — Norton Rose Fulbright US LLP

(57) ABSTRACT

Provided are an open-mode protection device and an electronic device having the same. An open-mode protection device according to an embodiment of the present invention is connected in parallel to each of a constant current source and a load configured with a light emitting diode (LED). The open-mode protection device comprises a first external electrode connected to one sides of the constant current source and the load; a second external electrode connected to the other sides of the constant current source and the load, and a ground; a protection unit configured to bypass, to the ground through the second external electrode, an overvolt-
(Continued)

age or an overcurrent flowing into the first external electrode; and a current suppressing unit connected in series to the protection unit and configured to sense a temperature or current of the protection unit and reduce the current of the protection unit as the temperature or current increases.

5 Claims, 9 Drawing Sheets

(51) Int. Cl.
  *H05B 45/40* (2020.01)
  *H01L 25/16* (2006.01)
  *H01L 33/36* (2010.01)
(58) Field of Classification Search
  USPC .......................................................... 315/291
  See application file for complete search history.

(56) References Cited

U.S. PATENT DOCUMENTS

2011/0193487 A1* 8/2011 Janik ................. H05B 33/0815
                                                            315/185 R
2013/0026924 A1* 1/2013 Jong .................. H05B 33/0818
                                                            315/113

FOREIGN PATENT DOCUMENTS

| JP | 09233686 | | 9/1997 |
| JP | 11097215 | | 4/1999 |
| KR | 10-20050082126 | | 8/2005 |
| KR | 20050082126 A | * | 8/2005 |
| KR | 10-20060093628 | | 8/2006 |
| KR | 20060093628 A | * | 8/2006 |
| KR | 20080034487 | | 4/2008 |
| KR | 101005199 | | 12/2010 |
| KR | 2012-0111214 | | 10/2012 |

OTHER PUBLICATIONS

Office Action issued in Corresponding Korean Patent Application No. 10-2016-0145756, dated Jun. 28, 2019. (English Translation).
Office Action issued in Corresponding Chinese Patent Application No. 201680074858, dated Jul. 16, 2019. (Partial English Translation).

* cited by examiner

OPEN-MODE PROTECTION DEVICE AND ELECTRONIC DEVICE HAVING SAME

CROSS-REFERENCE TO RELATED APPLICATIONS

This application is a national phase application under 35 U.S.C. § 371 of International Application No. PCT/KR2016/014985, filed Dec. 21, 2016, which claims priority to and the benefit of Korean Patent Applications No. 10-2015-0184278, filed Dec. 22, 2015, No. 10-2016-0145756, filed Nov. 3, 2016, and No. 10-2016-0174516, filed Dec. 20, 2016. The contents of the referenced patent applications are incorporated into the present application by reference.

FIELD OF THE DISCLOSURE

The present invention relates to an open-mode protection device, and more specifically, to an open-mode protection device capable of suppressing abnormal overheating of a protection device caused by an open-mode operation of a load, and an electronic device having the same.

DESCRIPTION OF RELATED ART

Recently, the use of light emitting devices (LEDs) as lighting devices has become commonplace, and particularly, owing to efficiency in lighting and ease of control, the use of LEDs has been rapidly increasing in the fields of display device backlights, various vehicle lamps, smart lighting which utilizes dimming, and the like.

Such LED lighting has a constant current type lighting circuit which supplies a constant current to a load made of LEDs. In such a constant current type, a current having a predetermined magnitude is supplied from a constant current source in a steady state, and thus the LEDs are turned on so as to have constant voltage values. For example, when a constant current source supplies 400 mA and a load is made of 10 LEDs, a voltage in the range of 25 to 30V is output.

A protection device is provided between the constant current source and the load to protect a circuit when electrostatic discharge (ESD), electrical overstress (EOS), or a surge flows into the circuit. Here, one side of the protection device is connected to the ground to bypass, to the ground, the ESD, EOS, or surge, which flows into the circuit.

In such a constant current type electronic device, when the protection device fails to sufficiently bypass the ESD, EOS, or surge, there often occurs a case in which one of the LEDs constituting the load is damaged by the ESD (static electricity), EOS, or surge, and thus the load enters an open state. Here, since the load is in the open state, all of the current supplied from the constant current source flows to the protection device. Accordingly, since the constant current source supplies a current having a predetermined magnitude, a condition in which the voltage rises to infinity is formed. That is, the voltage of the protection device continuously rises until the current having a predetermined magnitude supplied from the constant current source flows.

Here, a high voltage and a high current continuously flow into the protection device, and thus the temperature of the protection device rises, and in the worst case, the protection device may become damaged, or a fire may occur due to ignition. Particularly, when materials which are easy to ignite, such as white sheets of a television (TV) backlight on each of which LEDs are disposed, are adjacent to each other, there is a high probability of fire.

Consequently, there is a need for developing a technique capable of providing a protection function against ESD, EOS, or a surge current with respect to an LED load and also suppressing overheating of a protection device caused by an open mode of the load.

SUMMARY OF THE INVENTION

The present invention is directed to providing an open-mode protection device capable of suppressing abnormal overheating of a protection device caused by a constant current source when a load is in an open mode, and an electronic device having the same.

Further, the present invention is directed to providing, by distributing and arranging current suppressing functions, an open-mode protection device and an electronic device having the same capable of simultaneously achieving a function of suppressing abnormal overheating of a protection device caused by open mode operation of a load, and a high breakdown voltage for withstanding high voltages.

One aspect of the present invention provides an open-mode protection device connected in parallel to a constant current source and a load configured with a light emitting diode (LED). The open-mode protection device may include a first external electrode connected to one sides of the constant current source and the load; a second external electrode connected to a ground and the other sides of the constant current source and the load, a protection unit configured to bypass, to the ground through the second external electrode, an overvoltage or an overcurrent flowing into the first external electrode, and a current suppressing unit connected in series to the protection unit and configured to sense a temperature or current of the protection unit and reduce the current of the protection unit as the temperature or current increases.

A body of the protection unit may be made of a varistor material, and a body of the current suppressing unit may be made of a positive temperature coefficient (PTC) material or a polymeric PTC (PPTC) material.

Each of the protection unit and the current suppressing unit may be connected to either the first external electrode or the second external electrode.

For example, each of the protection unit and the current suppressing unit may be configured as a single body.

As another example, the protection unit may include a plurality of sheet layers, a first internal electrode and a second internal electrode which are spaced apart by a predetermined distance and face each other, and a connection electrode connected to the second internal electrode, the current suppressing unit may be configured as a single body, and the connection electrode may be disposed to be in contact with a portion of the current suppressing unit.

The first internal electrode may be connected to either the first external electrode or the second external electrode.

As still another example, the current suppressing unit may be configured with two current suppressing units connected to the first external electrode and the second external electrode, respectively, and the protection unit may be disposed between the two current suppressing units.

A first internal electrode and a second internal electrode may be provided at both sides of the protection unit, and each of the first internal electrode and the second internal electrode may be disposed to be in contact with a portion of the current suppressing unit.

As yet another example, a body of the open-mode protection device may be configured with a plurality of sheet layers, the protection unit may include a first internal electrode, and a common electrode spaced apart from the first internal electrode by a predetermined distance and disposed to face the first internal electrode, the current suppressing unit may include a second internal electrode spaced apart from the common electrode by a predetermined distance and disposed to face the common electrode, and an insulating member may be provided at both sides of the plurality of the sheet layers constituting the current suppressing unit to block an electrical connection between the first external electrode and the second external electrode.

Each of the first internal electrode and the second internal electrode may be connected to either the first external electrode or the second external electrode.

The current suppressing unit may be one among a bimetal, a fuse, a PPTC device, and a PTC device.

The protection unit may be one among a varistor, a suppressor, a gas discharge tube (GDT), and a diode.

Another aspect of the present invention provides an open-mode protection device connected in parallel to a constant current source and a load configured with light emitting diodes (LEDs), the open-mode protection device including current suppressing unit, which is configured with a pair of substrates, spaced apart from each other by a predetermined distance, and disposed on the same plane; a protection unit having electrodes provided at both sides of the protection unit, connected to electrodes of one side surfaces of the pair of the current suppressing units, and configured to bypass an overvoltage or an overcurrent; and a molding unit formed to cover upper sides of the pair of the current suppressing units and the protection unit. The current suppressing unit may reduce a current of the protection unit as a temperature or current of the protection unit increases.

A space portion between the pair of the current suppressing units may be filled with a molding member constituting the molding unit.

Electrodes of the other side surfaces of the pair of the current suppressing units may form a pair of external electrodes.

Still another aspect of the present invention provides an electronic device including a constant current source, a load configured with an LED which is driven by the constant current source, a ground terminal at which one sides of the constant current source and the load are connected, and the above-described open-mode protection device connected in parallel to the constant current source and the load and having one end connected to the ground terminal.

The constant current source may be one of a constant current driving unit and a constant current type power source.

In accordance with the present invention, a current suppressing unit configured of a polymeric positive temperature coefficient (PTC) device or a PPTC device is integrally formed with a protection unit, and an overcurrent or an abnormal temperature rise of the protection unit caused by open mode operation of a load is sensed to reduce a current so that a rise in temperature or current can be suppressed and thus damage to a protection device caused by abnormal overheating can be prevented.

Further, in accordance with the present invention, abnormal overheating of the protection device is suppressed so that damage to adjacent circuit components can be prevented and fire caused by ignition of the protection device can be prevented in advance.

Furthermore, in accordance with the present invention, the current suppressing unit and the protection unit are provided as a single body, such that there is no need to provide an internal electrode and thus production efficiency can be improved by a simplified structure and production costs can simultaneously be reduced.

Moreover, in accordance with the present invention, the protection unit is disposed between two current suppressing units so that thinness of the protection unit can be achieved to reduce an operating voltage and thus a protection function against an overvoltage or an overcurrent can be improved.

In addition, in accordance with the present invention, the current suppressing units configured with PTC devices or PPTC devices are distributed and disposed, and thus a function of suppressing the abnormal overheating of the protection device and a high breakdown voltage can be simultaneously implemented to suppress a rise in temperature or current of the protection device so that damage of the protection device caused by abnormal overheating can be prevented and thinness can be achieved without increasing a thickness of a material so as to increase the breakdown voltage.

DETAILED DESCRIPTION OF THE INVENTION

Figure 1:
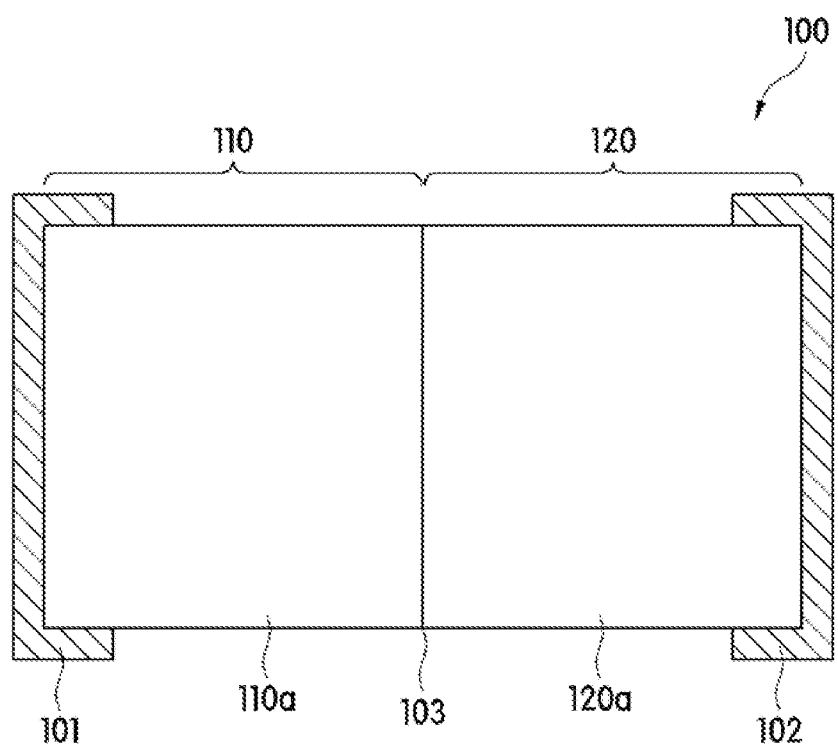
FIG. 1 is a sectional view of an example of an open-mode protection device according to one embodiment of the present invention.

Hereinafter, embodiments of the present invention will be fully described in detail, which is suitable for easy implementation by those skilled in the art to which the present invention pertains with reference to the accompanying drawings. The present invention may be implemented in various different forms, and thus is not limited to embodiments which will be described herein. In the drawings, some portions not related to the description will be omitted in order to clearly describe the present invention, and the same or similar reference numerals are given to identical or similar components throughout this disclosure.

As shown in FIG. 1, an open-mode protection device 100 according to one embodiment of the present invention includes a first external electrode 101, a second external electrode 102, a protection unit 110, and a current suppressing unit 120.

In an electronic device, the open-mode protection device 100 is connected in parallel to a load configured with a constant current source and light emitting devices (LEDs) and bypasses to the ground, electrostatic discharge (ESD), electrical over stress (EOS), or a surge current, which flows from the outside, thereby protecting a circuit including the constant current source and the load.

The first external electrode 101 is connected to one side of each of the constant current source and the load of the electronic device. That is, the first external electrode 101 may be connected to a position at which one end of the constant current source and one end of the load are connected.

The second external electrode 102 is connected to the other side of each of the constant current source and the load of the electronic device. That is, the second external electrode 102 may be connected to a position at which the other end of the constant current source and the other end of the load are connected. Here, the other side of the constant current source and the other side of the load are connected to the ground, and thus the second external electrode 102 is also connected to the ground.

The first external electrode 101 and the second external electrode 102 may be respectively disposed at both sides of the open-mode protection device 100.

The protection unit 110 bypasses, to the ground of the electronic device through the second external electrode 102, an overvoltage or an overcurrent flowing into the first external electrode 101.

The protection unit 110 may be configured as a single body 110a, and the body 110a may be formed of a varistor material. As another example, the body 110a may be made of a sintered body. Here, the sintered body may include one or more among ZnO, $BaTiO_3$, and $SrTiO_3$ and at least one among Pr, Bi, Ni, Mn, Cr, Co, Sb, Nd, Si, Ca, La, Mg, Al, Ti, Sn, Nb, and Y as a dopant.

The protection unit 110 may serve as a varistor which bypasses an overvoltage or an overcurrent to the ground.

The current suppressing unit 120 is connected in series to the protection unit 110, detects a temperature or current of the protection unit 110, and reduces the current of the protection unit 110 according to an increase in temperature or current caused by abnormal overheating or an overcurrent.

The current suppressing unit 120 may be formed of a single body 120a, and the body 120a may be formed of a positive temperature coefficient (PTC) material or a polymeric PTC (PPTC) material. That is, the current suppressing unit 120 may be a PPCT device or a PTC device.

For example, when the current suppressing unit 120 is a PPTC device, the current suppressing unit 120 may include a polymer in which a conductive filler is dispersed. That is, the body 120a of the current suppressing unit 120 may be made of a polymer. Here, the conductive filler may be made of a carbon black material.

As described above, the open-mode protection device 100 does not need to have a separate internal electrode because the protection unit 110 and the current suppressing unit 120, which are respectively made of a single body, are surface adhered and horizontally connected to each other at a connecting unit 103 between the first external electrode 101 and the second external electrode 102.

More specifically, since one side of the protection unit 110 is connected to the first external electrode 101, and the current suppressing unit 120 connected to the second external electrode 102 has low resistance at room temperature, the second external electrode 102 may serve as the other electrode of the protection unit 110 through the current suppressing unit 120. That is, in the protection unit 110, the first external electrode 101 and the second external electrode 102 may serve as electrodes of a varistor.

Thus, since there is no need to have an internal electrode, structure may be very simplified, and thus a production process thereof may be simplified and production efficiency may be improved, and furthermore, the open-mode protection device 100 may be produced at low cost.

Here, each of the protection unit 110 and the current suppressing unit 120 may be connected to either the first external electrode 101 or the second external electrode 102. For example, the protection unit 110 may be connected to the first external electrode 101, and the current suppressing unit 120 may be connected to the second external electrode 102. As another example, the protection unit 110 may be connected to the second external electrode 102, and the current suppressing unit 120 may be connected to the first external electrode 101.

Figure 2:
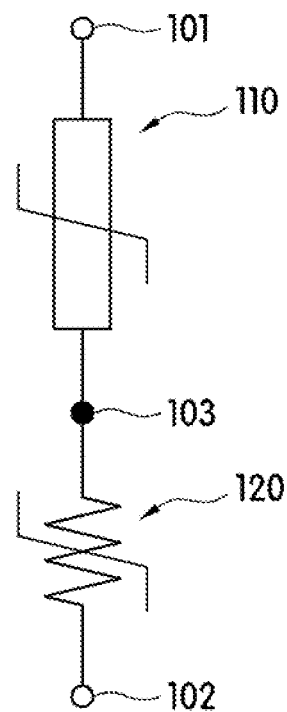
FIG. 2 is an equivalent circuit diagram of the open-mode protection device of FIG. 1.

As shown in FIG. 2, the open-mode protection device 100 may be embodied with an equivalent circuit in which a protection unit 110 such as a varistor and a current suppressing unit 120 such as a PPTC device or a PTC device are connected in series.

That is, in the open-mode protection device 100, each of the protection unit 110 and the current suppressing unit 120 is connected to either the first external electrode 101 or the second external electrode 102, and the protection unit 110 and the current suppressing unit 120 are connected to each other through the connecting unit 103, so that the protection unit 110 and the current suppressing unit 120 may be connected in series between the first external electrode 101 and the second external electrode 102.

Figure 3:
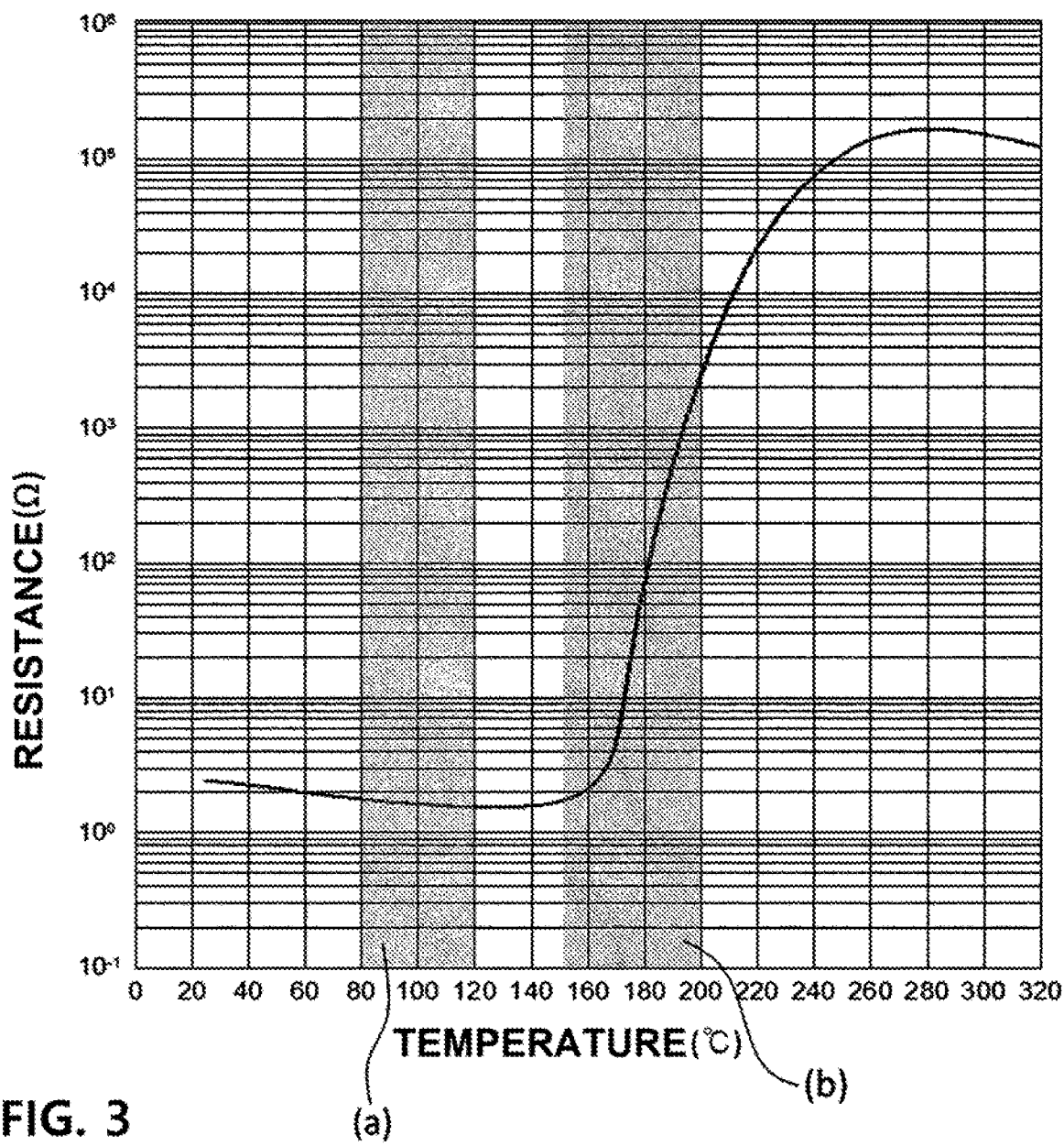
FIG. 3 is a graph showing a temperature characteristic of the open-mode protection device of FIG. 1.

As shown in FIG. 3, the current suppressing unit 120 in the open-mode protection device 100 according to the embodiment of the present invention has low resistance at an ordinary temperature in the range of 80 to 120° C. (see Region (a)). Here, the open-mode protection device 100 may serve as a protection device such as a varistor to protect a circuit by bypassing, to the ground, static electricity, EOS, or surge, which flows into the load.

Meanwhile, when the load made of LEDs is opened by ESD, EOS, or a surge from the outside, a current and a voltage flowing to the open-mode protection device 100 continuously increase, and thus the protection unit 110 overheats. That is, when the load is opened, all of a current having a predetermined magnitude supplied from the constant current source flows to the open-mode protection device 100 due to a power source of the load being a constant current source. Here, the actual load of the constant current source is the open-mode protection device 100, and in this case, since the current having the predetermined magnitude constantly flows from the constant current source to the open-mode protection device 100, voltage rises to infinity.

For example, when the load is in an open state, a voltage across both ends of the open-mode protection device 100, which is the actual load, rises to a power supply level (200 to 300 V), and thus the open-mode protection device 100, particularly the protection unit 120, overheats.

Here, when the open-mode protection device 100 overheats to a temperature in the range of 150° C. to 200° C., resistance of the current suppressing unit 120 in the open-mode protection device 100 rapidly rises to reduce the amount of a current flowing in the open-mode protection device 100, so that a voltage across both ends of the protection unit 110 may be reduced, temperature may be decreased, and thus heat generation may be suppressed (see Region (b)). Accordingly, it is possible to prevent damage to the open-mode protection device 100 caused by overheating of the protection unit 110.

Although in FIGS. 1 and 2 the protection unit 110 has been shown and described as the varistor and the current suppressing unit 120 has been shown and described as the PPTC device or the PTC device, the present invention is not limited thereto, the protection unit 110 and the current suppressing unit 120 may be configured in various forms.

For example, the protection unit 110 may be any one of a suppressor, a gas discharge tube (GDT), and a diode, but the protection unit 110 is not limited thereto and may include a device capable of bypassing an overvoltage or an overcurrent.

Further, the current suppressing unit 120 may be a bimetal which completely blocks a current path toward the protection unit 110 according to a temperature of the protection unit 110 or may be a fuse which is fused according to a current of the protection unit 110, but the current suppressing unit 120 is not limited thereto and may include a device capable of blocking the current path toward the protection unit 110 when the protection unit 110 abnormally overheats or an overcurrent flows into the protection unit 110, or capable of reducing the current of the protection unit 110.

Various modifications of the open-mode protection device 100 according to one embodiment of the present invention will be described below with reference to FIGS. 4 to 13.

Figure 4:
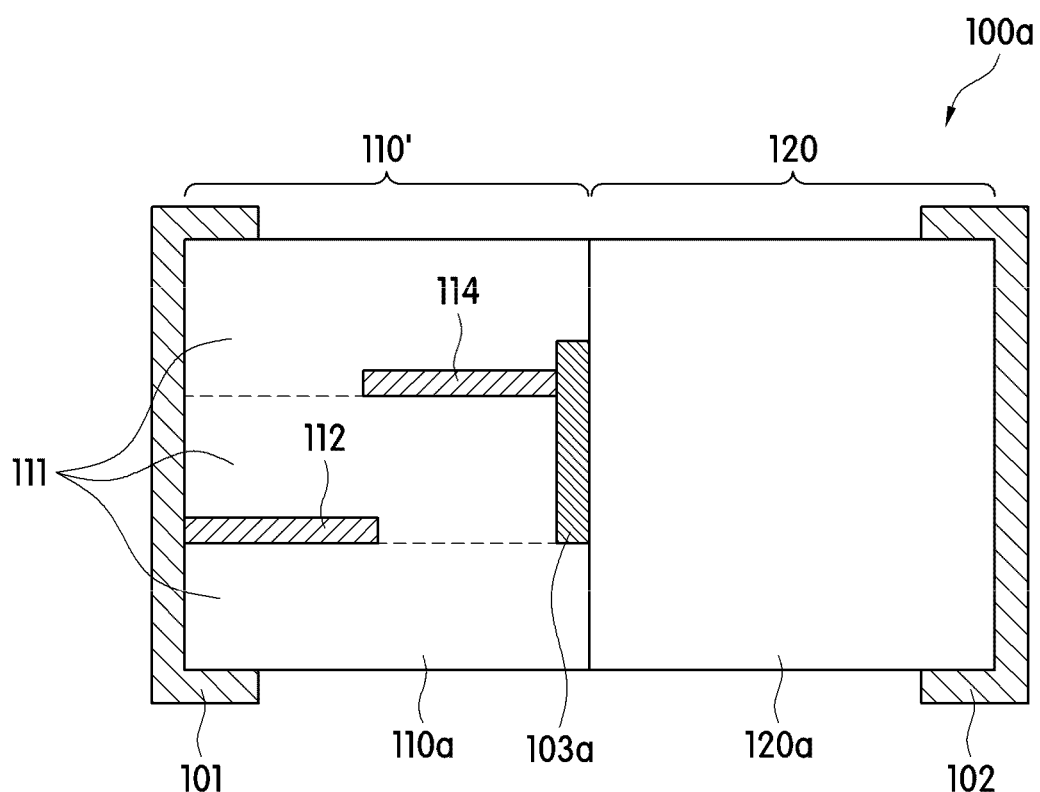
FIG. 4 is a cross-sectional view of another example of the open-mode protection device according to one embodiment of the present invention.
Figure 5:
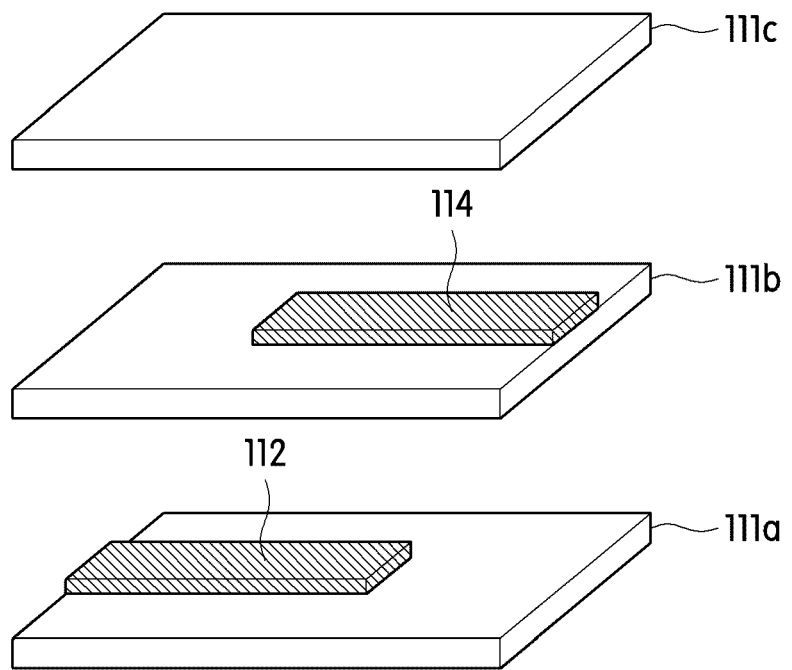
FIG. 5 is an exploded perspective view illustrating a stack relationship of a plurality of sheet layers in a protection unit.

As shown in FIGS. 4 and 5, in an open-mode protection device 100*a*, a protection unit 110' may include internal electrodes 112 and 114 and a connection electrode 103*a*.

That is, the protection unit 110' may include a first internal electrode 112 and a second internal electrode 114 which face each other and are spaced apart by a predetermined distance. To this end, the protection unit 110' may be configured with a plurality of sheet layers 111.

Here, a first sheet layer 111*a* may be disposed at a lowermost portion of the plurality of sheet layers 111, and the first internal electrode 112 connected to the first external electrode 101 or the second external electrode 102 may be provided on a top surface of the first sheet layer 111*a*. A second sheet layer 111*b* may be disposed above the first sheet layer 111*a*, and the second internal electrode 114 may be provided on a top surface of the second sheet layer 111*b*. A third sheet layer 111*c* may be disposed above the second sheet layer 111*b* and at an uppermost portion of the plurality of sheet layers 111. Here, the sheet layers 111*a*, 111*b*, and 111*c* are illustrated as being formed to have the same thickness in the drawings, but the present invention is not limited thereto, and the sheet layers 111*a*, 111*b*, and 111*c* may be formed to have different thicknesses.

Each of the plurality of sheet layers 111*a*, 111*b*, and 111*c* may be made of a varistor material. Consequently, the protection unit 110' may serve as a varistor having the first internal electrode 112 and the second internal electrode 114.

Here, the connection electrode 103*a* connected to the second internal electrode 114 may be provided at an interface between the protection unit 110' and the current suppressing unit 120. That is, the connection electrode 103*a* may be disposed to be in contact with a part of the current suppressing unit 120.

The connection electrode 103*a* may serve as an electrode of one side of the current suppressing unit 120 and, simultaneously, may function as a connecting unit configured to connect the protection unit 110' and the current suppressing unit 120. That is, the connection electrode 103*a* and the second external electrode 102 may constitute electrodes of both ends of the current suppressing unit 120.

Thus, the protection unit 110' may easily adjust an operating voltage using a distance between the first internal electrode 112 and the second internal electrode 114 and characteristics of the first internal electrode 112 and the second internal electrode 114. Further, since the protection unit 110' forms an operating voltage lower than that of the protection unit 110 of FIG. 1, a protection function against an overvoltage or an overcurrent may be improved.

A configuration of the open-mode protection device 100*a* is the same as that of the open-mode protection device 100 of FIG. 1 except for the internal electrodes and the connection electrode of the protection unit, and thus a detailed description thereof will be omitted.

Figure 6:
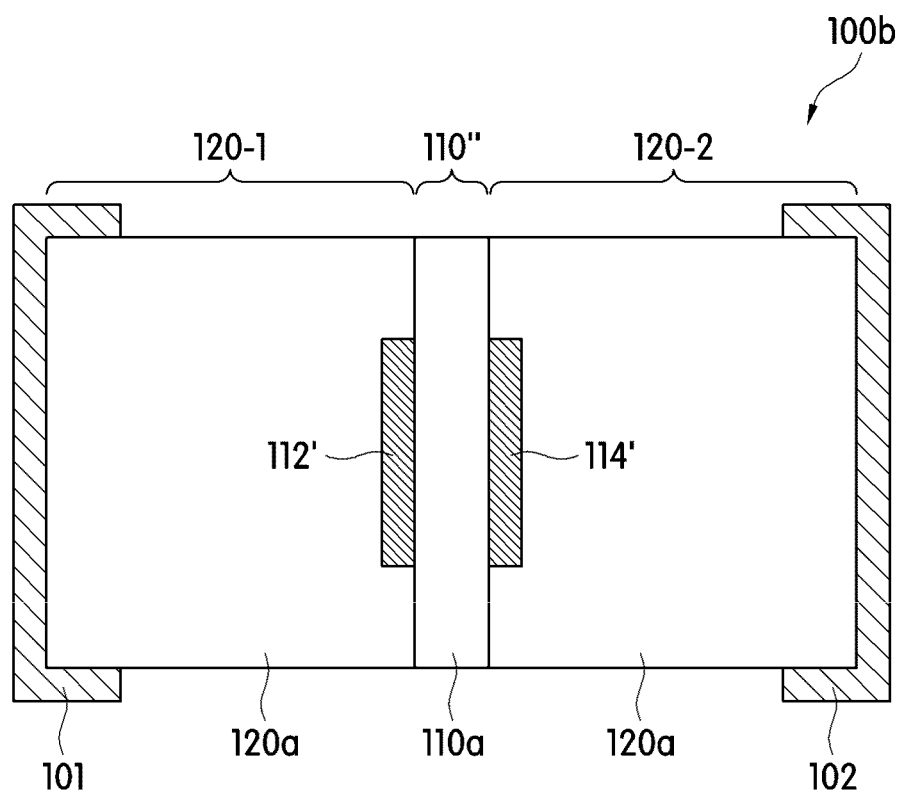
FIGS. 6 and 7 are a cross-sectional view and an exploded perspective view of still another example of the open-mode protection device according to one embodiment of the present invention.
Figure 7:
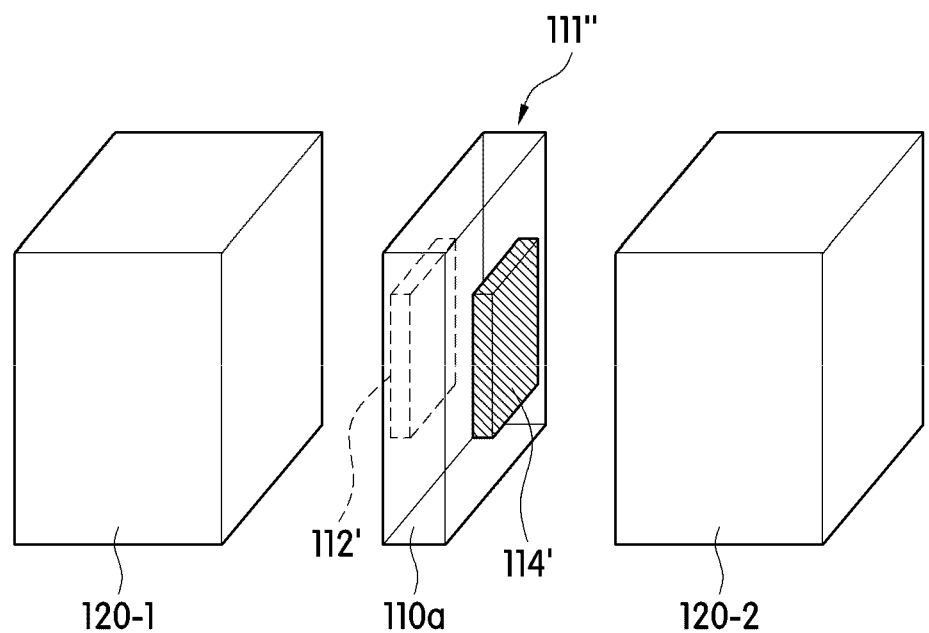

As shown in FIGS. 6 and 7, an open-mode protection device 100*b* may include two current suppressing units 120-1 and 120-2 and a protection unit 110" disposed between the current suppressing units 120-1 and 120-2.

That is, the two current suppressing units 120-1 and 210-2 are respectively connected to either the first external electrode 101 or the second external electrode 102, and the protection unit 110" is oriented so as to be connected to each of the current suppressing units 120-1 and 120-2.

Here, a first internal electrode 112' and a second internal electrode 114' may be provided at both sides of the protection unit 110". At this time, the first internal electrode 112' and the second internal electrode 114' may be disposed to be in contact with a part of the current suppressing unit 120.

The first internal electrode 112' and the second internal electrode 114' may serve as electrodes of one sides of the current suppressing units 120-1 and 120-2, respectively. That is, the first external electrode 101 and the first internal electrode 112' may constitute electrodes of both ends of the current suppressing unit 120-1, and the second internal electrode 114' and the second external electrode 102 may constitute electrodes of both sides of the current suppressing unit 120-2.

Here, the protection unit 110" or the current suppressing units 120-1 and 120-2 may be formed of a single body 110*a* or 120*a*.

As described above, since the protection unit 110" is disposed between the current suppressing units 120-1 and 120-2, the protection unit 110" is sufficiently spaced apart from the first external electrode 101 and the second external electrode 102 by the current suppressing units 120-1 and 120-2, and thus influence from the first external electrode 101 and the second external electrode 102 may be eliminated and thinness of the body 110*a* of the protection unit 110" may be achieved.

Consequently, the open-mode protection device 100*b* may be provided with the protection unit 110" having a low operating voltage, thereby further improving a protection function against an overvoltage or an overcurrent.

Figure 8:
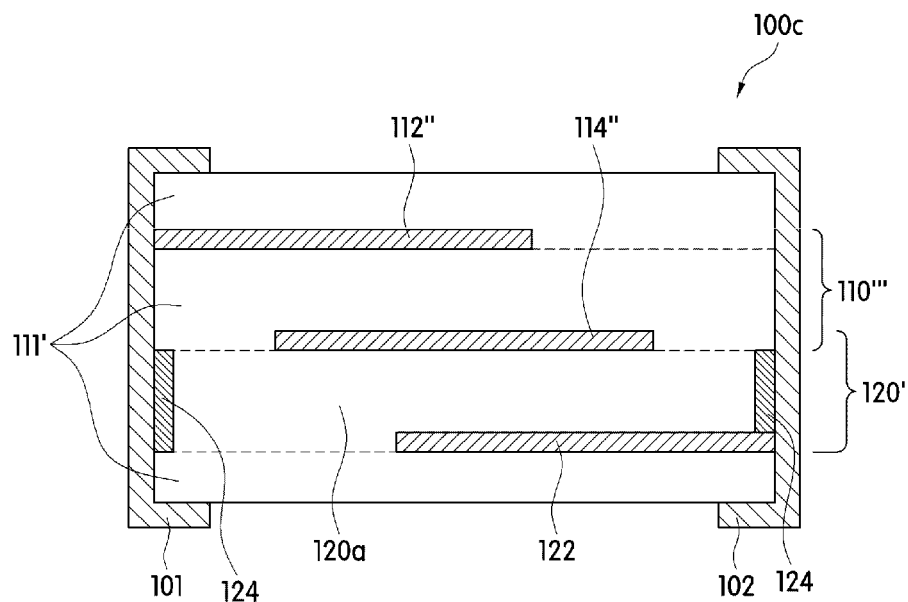
FIG. 8 is a cross-sectional view of still another example of the open-mode protection device according to one embodiment of the present invention.
Figure 9:
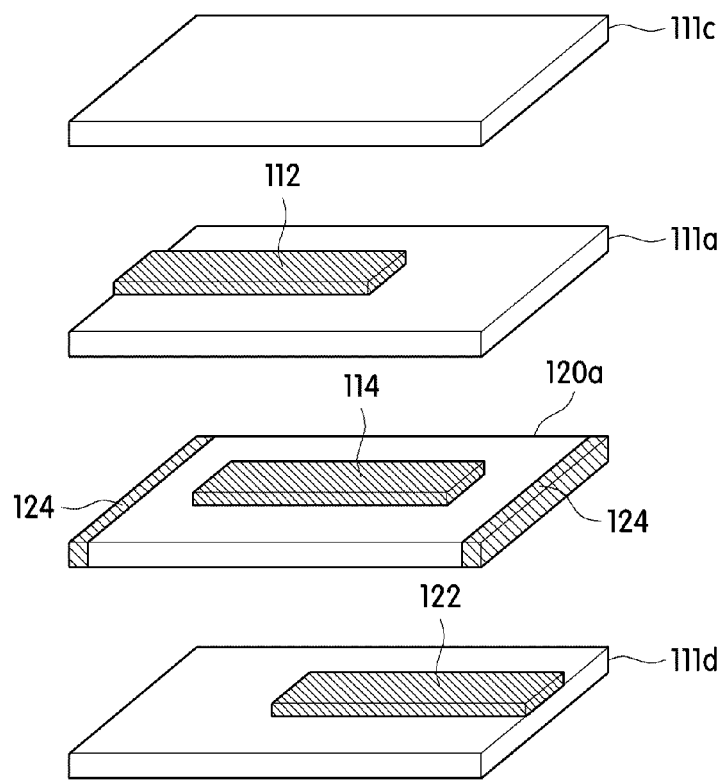
FIG. 9 is an exploded perspective view illustrating a stack relationship of a plurality of sheet layers.
Figure 10:
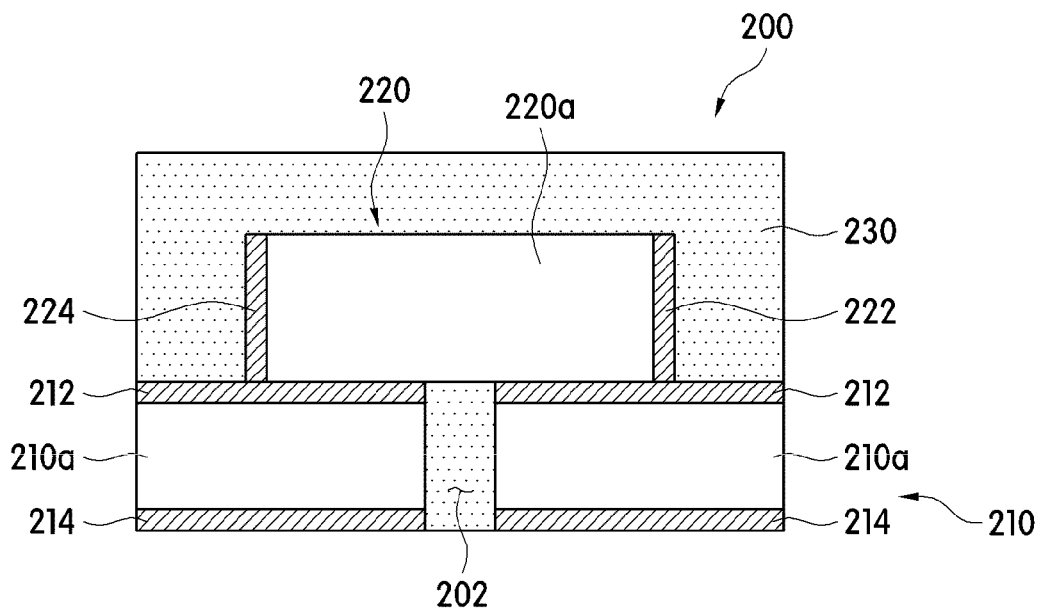
FIG. 10 is a cross-sectional view of yet another example of the open-mode protection device according to the embodiment of the present invention.
Figure 11:
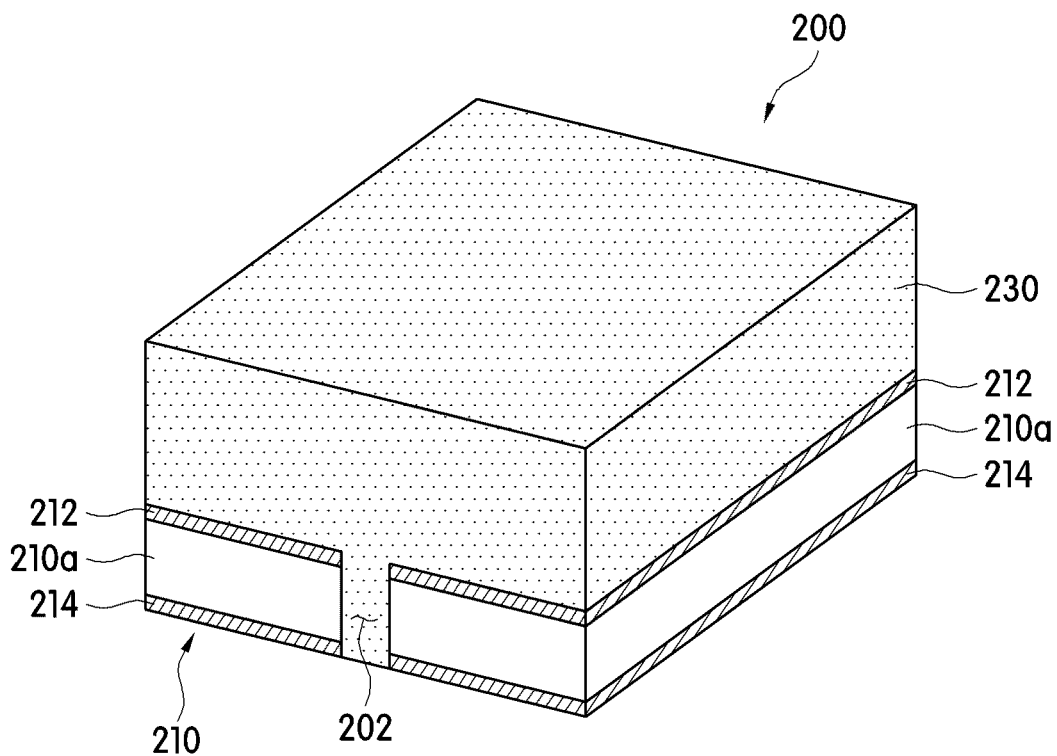
FIG. 11 is a perspective view of the open-mode protection device of FIG. 10.

As shown in FIGS. 8 and 9, an open-mode protection device 100*c* may be configured with a plurality of sheet layers 111'. That is, in the open-mode protection device 100c, a protection unit 110''' and a current suppressing unit 120' may be vertically connected.

Here, a first internal electrode 112'' connected to the first external electrode 101 or the second external electrode 102 may be provided on a top surface of a first sheet layer 111a. A second sheet layer 120a may be disposed below the first sheet layer 111a, and a common electrode 114'' may be provided on a top surface of the second sheet layer 120a. A third sheet layer 111c may be disposed above the first sheet layer 111a and at an uppermost portion of the plurality of sheet layers 111'. A fourth sheet layer 111d may be disposed below the second sheet layer 120a, and a second internal electrode 122 connected to the first external electrode 101 or the second external electrode 102 may be provided on a top surface of the fourth sheet layer 111d. Here, the sheet layers 111a, 111b, 111c, and 111d are illustrated as being formed to have the same thickness in the drawings, but the present invention is not limited thereto, and the sheet layers 111a, 111b, 111c, and 111d may be formed to have different thicknesses.

The plurality of sheet layers 111' may be made of different materials.

For example, the first sheet layer 111a disposed between the first internal electrode 112'' and the common electrode 114'' may be made of a varistor material, and the second sheet layer 120a disposed between the common electrode 114'' and the second internal electrode 122 may be made of a PPTC material or a PTC material. Here, the third sheet layer 111c and the fourth sheet layer 111d may be formed of a varistor material like the first sheet layer 111a, or a ceramic material.

In this case, since the second sheet layer 120a made of the PPTC material or the PTC material has low resistance at room temperature, an electrical connection between the first external electrode 101 and the second external electrode 102 should be blocked. To this end, an insulating member 124 may be provided at both side portions of the second sheet layer 120a, which are connected to the first external electrode 101 and the second external electrode 102.

The protection unit 110''' may include the first internal electrode 112'', the common electrode 114'', and the first sheet layer 111a. Here, the protection unit 110''' may include the first internal electrode 112'', and the common electrode 114'' spaced apart from the first internal electrode 112'' by a predetermined distance and disposed to face the first internal electrode 112''.

Further, the current suppressing unit 120' may include the common electrode 114'', the second internal electrode 122, and the second sheet layer 120a. Here, the current suppressing unit 120' may include the common electrode 114'', and the second internal electrode 122 spaced apart from the common electrode 114'' by a predetermined distance and disposed to face the common electrode 114''.

As described above, the common electrode 114'' may serve as an electrode of one side of each of the protection unit 110''' and the current suppressing unit 120', and thus the protection unit 110'' and the current suppressing unit 120' may be connected in series between the first external electrode 101 and the second external electrode 102.

Here, the protection unit 110'' is illustrated and described as being stacked and disposed above the current suppressing unit 120', but the present invention is not limited thereto, the protection unit 110'' may be stacked and disposed above or below the current suppressing unit 120'.

As shown in FIGS. 10 to 13, an open-mode protection device 200 may include two current suppressing units 210 which are disposed on the same plane. The open-mode protection device 200 may include a current suppressing unit 210, a protection unit 220, and a molding unit 230.

The current suppressing unit 210 is configured with a pair of substrates. Here, a pair of current suppressing units 210 are disposed on the same plane and spaced apart from each other by a predetermined distance. Electrodes 212 and 114 may be formed at both surfaces of each of the pair of current suppressing units 210.

Here, the electrodes 212 formed at one sides of the pair of current suppressing units 210 may be connected to the protection unit 220, and the electrodes 214 formed at the other sides of the pair of the current suppressing units 210 may form a pair of external electrodes. For example, upper surface electrodes 212 of the pair of current suppressing units 210 are internal electrodes connected in series to the protection unit 220, and lower surface electrodes 214 are external electrodes connected to a constant current source and a load, respectively.

That is, one of the external electrodes 214 may be connected to a position at which one end of the constant current source and one end of the load are connected, and the other external electrode 214 may be connected to a position at which the other end of the constant current source and the other end of the load are connected. The external electrodes 214 may be disposed on both sides of a lower surface of the open-mode protection device 200. Here, one of the positions at which the constant current source and the load are connected may be connected to the ground.

Here, a breakdown voltage of the current suppressing unit 210 increases according to a thickness of the current suppressing unit 210. That is, the breakdown voltage of the current suppressing unit 210 increases as a distance between the internal electrode 212 on an upper surface of a substrate layer 210a and the external electrode 214 on a lower surface of the substrate layer 210a increases. Therefore, in order to apply the current suppressing unit 210 to a backlight (BLU) of a display device such as a TV requiring a high breakdown voltage, a distance between the internal electrode 212 and the external electrode 214 should be configured to become larger, but this causes an increase in the overall thickness of the open-mode protection device 200.

Thus, in order to implement thinness of the open-mode protection device 200 according to the embodiment of the present invention without increasing a thickness of the open-mode protection device 200, the current suppressing unit 210 is disposed on the same plane and spaced apart from each other. That is, since the pair of the current suppressing units 210 are disposed on the same plane, an increase in thickness is suppressed, and at the same time, the pair of the current suppressing units 210 are electrically disposed in series on a current path at both sides of the protection unit 220, such that a breakdown voltage may be increased.

The current suppressing units 210 is electrically connected in series to both ends of the protection unit 220 to sense a temperature or a current of the protection unit 220. Here, when the load enters an open state due to damage to any one of a plurality of LEDs which are targets of protection, as all of a current supplied from the constant current source flows to the protection unit 220 and a temperature or current of the protection unit 220 increases, the current suppressing units 210 reduces the current of the protection unit 220.

Here, the current suppressing units 210 may be one of a PPTC device and a PTC device, which reduces current according to a rise in temperature of the protection unit 220.

That is, the current suppressing unit 210 may be made of a PTC material or a PPTC material.

Here, the internal electrode 212 and the external electrode 214 may be formed by plating Ni or Cu on the substrate layer 210a. Here, plating may be performed with one of Fe, Ni, Cr, and Ag so as to improve adhesiveness of a Cu surface. Further, the external electrode 214, which is used as a pad, may be further plated with one of Ag, Pt, Sn, Cr, Al, Zn, and Au so as to improve solderability.

Electrodes 222 and 124 of both ends of the protection unit 220 are connected to the internal electrodes 212 formed on upper surfaces of the pair of the current suppressing units 210, and thus the protection unit 220 bypasses an overvoltage or an overcurrent. That is, the protection unit 220 may bypass an overvoltage or an overcurrent caused by ESD, EOS, or a surge flowing in through one external electrode 214 to the other external electrode 214 connected to the ground.

Here, the protection unit 220 may be a single premanufactured part. For example, the protection unit 220 may be any one of a varistor, a suppressor, a GDT, and a diode, but the protection unit 220 is not limited thereto and may include a device capable of bypassing an overvoltage or an overcurrent.

Consequently, the existing single component is mounted on the pair of the current suppressing units 210, and thus a manufacturing process may be simplified and the current suppressing unit 210 may be easily designed and arranged according to existing products.

Figure 12:
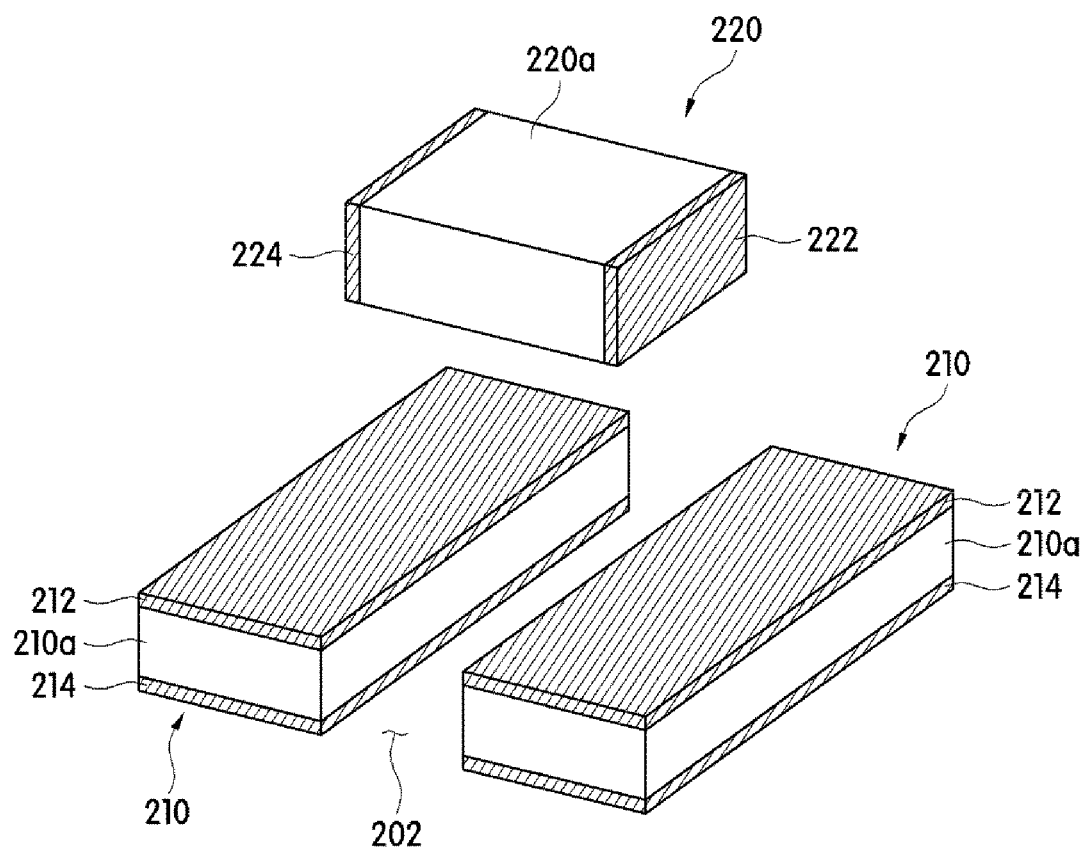
FIG. 12 is an exploded perspective view illustrating a stack relationship of the open-mode protection device of FIG. 10.

The protection unit 220 may be stacked and disposed on top of the pair of the current suppressing units 210 (see FIG. 12). Here, the protection unit 220 may be connected to the internal electrodes 212 of the pair of the current suppressing units 210 through soldering. That is, the protection unit 220 may be mounted on the internal electrodes 212 of the pair of the current suppressing units 210 through surface mount technology (SMT) soldering.

Further, when the load configured with LEDs is operated in an open mode, the protection unit 220 bypasses a constant current of the constant current source to the ground through the external electrodes 214.

The protection unit 220 may include a varistor material layer. That is, the body 220a of the protection unit 220 may be made of a varistor material.

As another example, the body 220a may be made of a sintered body. Here, the sintered body may include one or more among ZnO, BaTiO$_3$, and SrTiO$_3$ and at least one among Pr, Bi, Ni, Mn, Cr, Co, Sb, Nd, Si, Ca, La, Mg, Al, Ti, Sn, Nb, and Y as a dopant.

The molding unit 230 is formed to cover the protection unit 220 and upper sides of the pair of the current suppressing units 210 so as to protect the pair of the current suppressing units 210 and the protection unit 220 and package the pair of the current suppressing units 210 and the protection unit 220 as a single device.

The molding unit 230 may be formed of a molding member which is made of epoxy. Here, the molding member may fill not only the upper sides of the pair of the current suppressing units 210 but also a space portion 202 between the pair of the current suppressing units 210.

That is, as the pair of the current suppressing units 210 are disposed and spaced apart from each other, the space portion 202 formed between the pair of the current suppressing units 210 may be filled with the molding member configuring the molding unit 230. Here, when molding is applied to surround the outside of the open-mode protection device 200, the space portion 202 may be filled with the molding member (see FIG. 11).

Consequently, rigidity of the pair of the current suppressing units 210 disposed and spaced apart from each other may be enhanced. That is, since the pair of the current suppressing units 210 are disposed and spaced apart from each other, and thus coupling strength between the pair of the current suppressing units 210 or between the pair of the current suppressing units 210 and the protection unit 220 may be weakened, the space portion 202 may be filled with the molding member to enhance the coupling strength therebetween.

Further, exposure of the protection unit 220 is prevented between the pair of the current suppressing units 210, and thus the protection unit 220 may be safely protected from an external force.

Meanwhile, since the molding unit 230 is formed to cover upper portions of the pair of the current suppressing units 210, lateral surfaces of the pair of the current suppressing units 210 are illustrated and described as being exposed, but the present invention is not limited thereto, and the molding unit 230 may be formed to cover all the lateral surfaces of the pair of the current suppressing units 210.

In this case, the external electrodes 214 formed on the lower surfaces of the current suppressing unit 210 may be formed to protrude further to the outside than the side surfaces.

As another example, the molding unit 230 may be formed such that lateral surfaces of the molding unit 230 are formed to cover the current suppressing unit 210 but is formed to cover only the upper surfaces of the current suppressing unit 210 without covering the lower surfaces thereof, so as to allow the external electrodes 214 to be exposed.

Consequently, positioning accuracy and cutting accuracy may be maintained and managed at a low level during a manufacturing process, so that additional effort may not be required to improve accuracy and thus manufacturing costs may be reduced.

Figure 13:
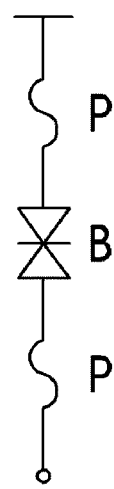
FIG. 13 is an equivalent circuit diagram of the open-mode protection device of FIG. 10.

As shown in FIG. 13, the open-mode protection device 200 may be embodied as an equivalent circuit in which a protection unit B such as a varistor and current suppressing units 120 such as PPTC devices or PTC devices are connected in series. In this case, the current suppressing units P may be distributed and disposed at both ends of the protection unit B.

That is, one ends of a pair of the current suppressing units P are connected to a pair of external terminals of the open-mode protection device 200, and both ends of the protection unit B are connected to the other ends of the pair of the current suppressing units P, so that the pair of the current suppressing units P and the single protection unit P may be connected in series to the external terminal.

The open-mode protection device 100, 100a, 100b, 100c, or 200 according to the embodiment of the present invention may be used in an electronic device including a constant current source and a load which is configured with LEDs.

Figure 14:
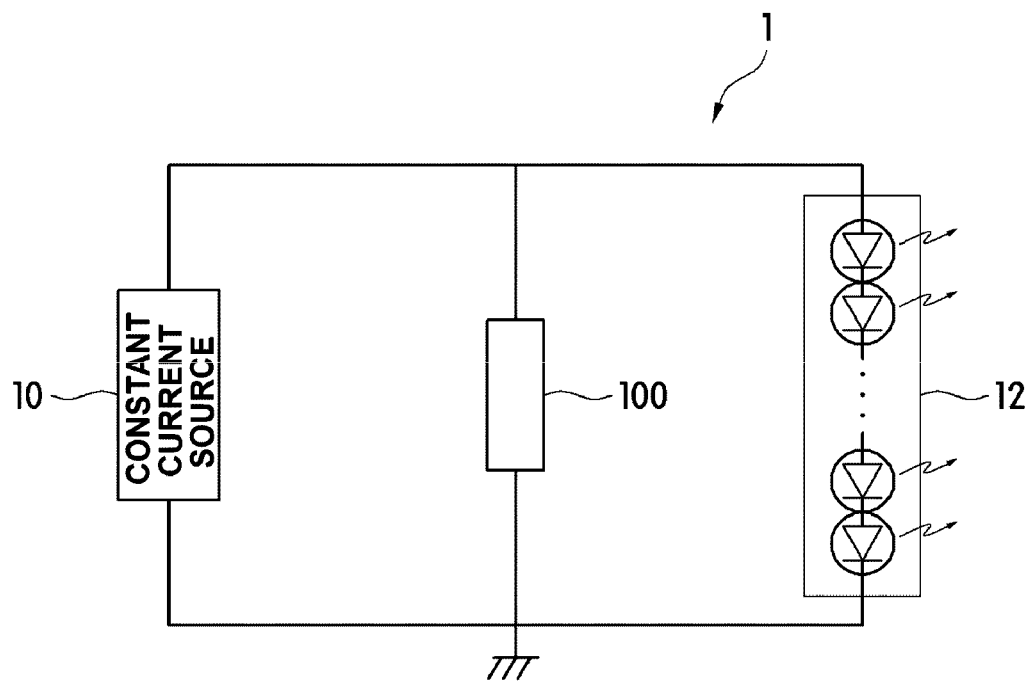
FIG. 14 is a schematic block diagram of an electronic device having the open-mode protection device according to one embodiment of the present invention.

As shown in FIG. 14, an electronic device 1 may include a constant current source 10, an LED load 12, a ground terminal, and the open-mode protection device 100.

Here, the electronic device 1 is a device including LEDs as a load and may be one among a BLU of a display device such as a TV, various vehicle lamps, and smart lighting which utilizes dimming.

The constant current source 10 may supply a current having a predetermined magnitude to the LED load 12. The constant current source 10 may be one of a constant current type power source and a constant current driver. That is, the constant current source 10 is not limited to a particular type and may be a source for supplying a current using a constant current method, and for example, the constant current source 10 may be a power source for supplying power to the electronic device 1 or a driving unit configured to drive the LED load 12.

The LED load 12 may be configured with a plurality of LEDs. Here, the LED load 12 may be configured with a plurality of LEDs connected in series, but the present invention is not limited thereto. For example, the LED load 12 may be configured such that a plurality of LEDs may be connected in series, a plurality of LEDs connected in series may be connected in parallel, a plurality of LEDs may be connected in parallel, and a plurality of LEDs connected in parallel may be connected in series.

The LED load 12 may have a predetermined voltage value as a current having a predetermined magnitude is supplied from the constant current source 10 and thus the LEDs are lit. For example, when the constant current source 10 supplies a current of 400 mA and the LED load 12 is configured with 10 LEDs, a voltage in the range of approximately 25 to 30V may be output across both ends of the load.

Here, one sides of the constant current source 10 and the LED load 12 are connected to the ground terminal. That is, negative terminals of the constant current source 10 and the load 12 may be connected to the ground terminal. The ground terminal may be connected to a common ground formed at a circuit board of the electronic device 1.

The open-mode protection device 100 may be connected in parallel to each of the constant current source 10 and the LED load 12. That is, one side of the open-mode protection device 100 may be connected to one sides of the constant current source 10 and the LED load 12, and the other side thereof may be connected to the other sides of the constant current source 10 and the LED load 12. Here, the one side of the open-mode protection device 100 may be connected to the ground terminal.

Figure 15:
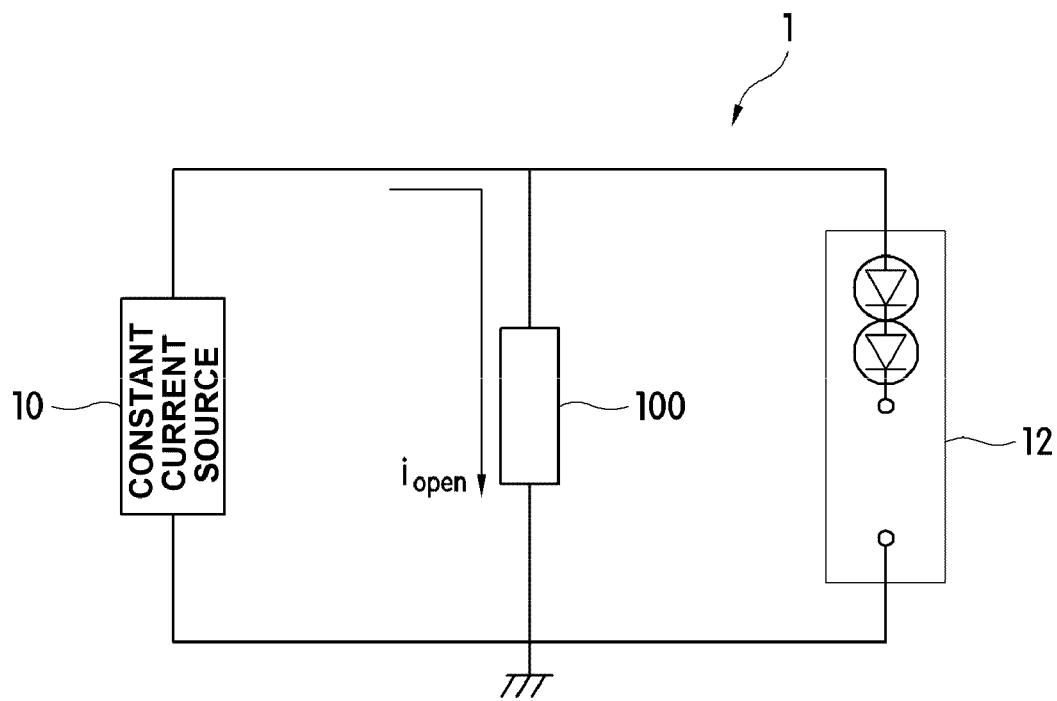
FIG. 15 is a diagram for describing normal operation of a load in the electronic device of FIG. 14.

As shown in FIG. 15, when the LED load 12 is in a normal operation state and ESD, EOS, or a surge flows into the LED load 12 from the outside, the electronic device 1 allows a current iESD corresponding to the ESD, EOS, or surge flowing to the open-mode protection device 100 to bypass the current iESD to the ground terminal, thereby protecting the LED load 12 from the ESD, EOS, or surge.

That is, since the resistance of a current suppressing unit such as a PPTC device or a PTC device is very small, the open-mode protection device 100 substantially serves as a protection device such as a varistor for the ESD, EOS, or surge by a protection unit.

Meanwhile, when the protection unit does not have a sufficient protection function against the ESD, EOS, or surge flowing from the outside, a portion of the LED load 12 may be damaged by the ESD, EOS, or surge, and thus the LED load 12 often enters an open state.

Figure 16:
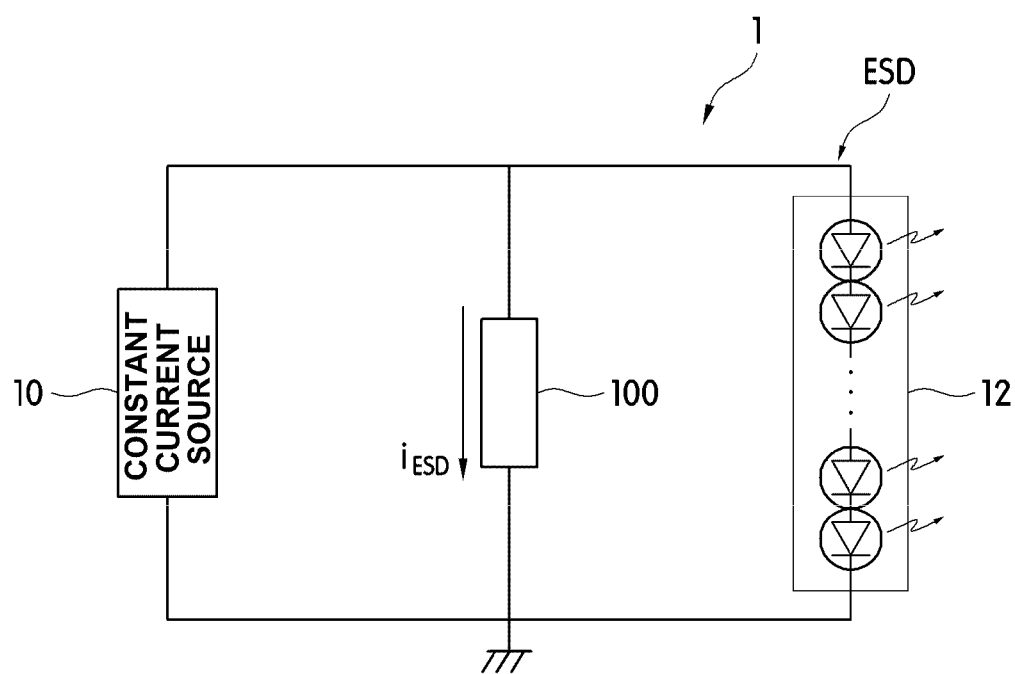
FIG. 16 is a diagram for describing open mode operation of the load in the electronic device of FIG. 14.

Here, as shown in FIG. 16, all of a current $i_{open}$ of the constant current source 10 flows to the open-mode protection device 100.

Accordingly, since the constant current source 10 continuously supplies a constant current, the current flowing in the open-mode protection device 100 increases and a voltage increases significantly. Consequently, a temperature of the protection unit of the open-mode protection device 100 gradually rises due to an overcurrent and an overvoltage.

Here, when the temperature of the protection unit rises to a predetermined temperature or higher, a resistance value of the current suppressing unit is significantly increased to reduce the current flowing in the protection unit, such that a rise in temperature of the protection unit can be suppressed.

Accordingly, abnormal overheating of the open-mode protection device 100 is suppressed, and thus damage to a circuit component adjacent to the open-mode protection device 100 can be prevented, and when an adjacent component is made of a combustible material, e.g., when a white sheet is disposed on front surfaces of LEDs so as to improve efficiency of light emitted from the LEDs, it is possible to prevent, in advance, fire caused by ignition of a protection device.

Although one embodiment of the present invention has been described, the spirit of the present invention is not limited to the embodiment disclosed herein, and it should be understood that those skilled in the art can devise numerous other embodiments falling within the same spirit and scope of this disclosure through addition, modification, deletion, supplementation, and the like of a component, and these other embodiments will also fall within the spirit and scope of the present invention.

The invention claimed is:

1. An open-mode protection device connected in parallel to a constant current source and a load configured with a light emitting diode (LED), the open-mode protection device comprising:
   a protection unit having electrodes provided at first and second sides of the protection unit connected to electrodes of a pair of current suppressing units such that the series connection of the pair of the current suppressing units and the protection unit together are connected in parallel with the load, wherein the protection unit is configured to bypass an overvoltage or an overcurrent, wherein the pair of the current suppressing units are configured with a pair of substrates wherein the pair of the current suppressing units are spaced apart from each other by a predetermined distance, and wherein the pair of the current suppressing units are disposed on the same plane; and
   a molding unit formed to cover at least one side of each current suppressing unit of the pair of the current suppressing units and at least one side of the protection unit,
   wherein the pair of current suppressing units is electrically disposed in series on a current path through the protection unit at the first and second sides of the protection unit and configured to sense a temperature of the protection unit and to reduce a current of the protection unit as a temperature of the protection unit increases by increasing a voltage of the protection unit while the constant current source supplies a constant current and when a load configured with the light emitting diode (LED) enters an open state.

2. The open-mode protection device of claim 1, wherein a space portion between the pair of the current suppressing units is filled with a molding member constituting the molding unit.

3. The open-mode protection device of claim 1, wherein electrodes of other surfaces of the pair of the current suppressing units form a pair of external electrodes.

4. An electronic device comprising:
   a constant current source;
   a load configured with an LED which is driven by the constant current source;
   a ground terminal at which one side of the constant current source and the load are connected; and the open-mode protection device according to claim 1, connected in parallel to the constant current source and the load and having one end connected to the ground terminal.

5. The electronic device of claim 4, wherein the constant current source is one of a constant current driving unit and a constant current type power source.

* * * * *

UNITED STATES PATENT AND TRADEMARK OFFICE
CERTIFICATE OF CORRECTION

PATENT NO. : 10,652,982 B2
APPLICATION NO. : 16/063614
DATED : May 12, 2020
INVENTOR(S) : Jae Wook Lee et al.

Page 1 of 1

It is certified that error appears in the above-identified patent and that said Letters Patent is hereby corrected as shown below:

On the Title Page

(30) Foreign Application Priority Data:
Add the following:
-- December 22, 2015 (KR) ................. 10-2015-0184278
November 3, 2016 (KR) ................. 10-2016-0145756 --

Signed and Sealed this
First Day of September, 2020

Andrei Iancu
*Director of the United States Patent and Trademark Office*